(12) United States Patent
Ausschnitt et al.

(10) Patent No.: US 7,626,702 B2
(45) Date of Patent: Dec. 1, 2009

(54) OVERLAY TARGET AND MEASUREMENT METHOD USING REFERENCE AND SUB-GRIDS

(75) Inventors: Christopher P. Ausschnitt, Boston, MA (US); Jaime D. Morillo, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/026,869

(22) Filed: Feb. 6, 2008

(65) Prior Publication Data

US 2008/0144031 A1  Jun. 19, 2008

Related U.S. Application Data

(62) Division of application No. 11/100,249, filed on Apr. 6, 2005, now Pat. No. 7,359,054.

(51) Int. Cl.
  *G01B 11/00* (2006.01)
  *G06K 11/00* (2006.01)
(52) U.S. Cl. .................................. 356/401; 382/151
(58) Field of Classification Search ................. None
  See application file for complete search history.

(56) References Cited

U.S. PATENT DOCUMENTS

| | | |
|---|---|---|
| 4,166,219 A | 8/1979 | Ausschnitt et al. |
| 4,290,384 A | 9/1981 | Ausschnitt et al. |
| 4,437,760 A | 3/1984 | Ausschnitt |
| 4,538,105 A | 8/1985 | Ausschnitt |
| 4,568,189 A | 2/1986 | Bass et al. |

(Continued)

FOREIGN PATENT DOCUMENTS

JP  61-168227  7/1986

(Continued)

OTHER PUBLICATIONS

Starikov, Alexander; "Exposure Monitor Structure" Integrated Circuit Metrology, Inspection and Process Control IV, 1990, pp. 315-324.

(Continued)

*Primary Examiner*—Gregory J Toatley, Jr.
*Assistant Examiner*—Gordon J Stock, Jr.
(74) *Attorney, Agent, or Firm*—DeLio & Peterson, LLC; Peter W. Peterson; Wenjie Li

(57) ABSTRACT

A method of determining alignment error in electronic substrates comprises providing on a layer of a substrate a first contrasting set of elements forming a first grid pattern having a plurality of grid segments in the x and y directions. The method also includes providing nested within at least one of the first grid pattern segments, on the same or different layer of a substrate, a second contrasting set of elements forming a second grid pattern having a plurality of grid segments in the x and y directions. The method then includes determining the center of the first set of elements in the first grid pattern and determining the center of the second set of elements in the second grid pattern. The method then comprises comparing the centers of the first and second sets of elements and determining alignment error of the first and second grid patterns.

11 Claims, 12 Drawing Sheets

U.S. PATENT DOCUMENTS

| | | | |
|---|---|---|---|
| 4,677,296 A * | 6/1987 | Lischke et al. ............... 250/310 |
| 4,848,911 A | 7/1989 | Uchida et al. |
| 4,890,239 A | 12/1989 | Ausschnitt et al. |
| 5,300,786 A | 4/1994 | Brunner et al. |
| 5,343,292 A | 8/1994 | Brueck et al. |
| 5,545,593 A | 8/1996 | Watkins et al. |
| 5,629,772 A | 5/1997 | Ausschnitt |
| 5,712,707 A | 1/1998 | Ausschnitt et al. |
| 5,731,877 A | 3/1998 | Ausschnitt |
| 5,756,242 A | 5/1998 | Koizumi et al. |
| 5,757,507 A | 5/1998 | Ausschnitt et al. |
| 5,776,645 A | 7/1998 | Barr et al. |
| 5,790,254 A | 8/1998 | Ausschnitt |
| 5,805,290 A | 9/1998 | Ausschnitt et al. |
| 5,877,861 A | 3/1999 | Ausschnitt et al. |
| 5,914,784 A | 6/1999 | Ausschnitt et al. |
| 5,928,822 A | 7/1999 | Rhyu |
| 5,949,547 A | 9/1999 | Tseng et al. |
| 5,952,134 A | 9/1999 | Hwang |
| 5,953,128 A | 9/1999 | Ausschnitt et al. |
| 5,965,309 A | 10/1999 | Ausschnitt et al. |
| 5,968,693 A | 10/1999 | Adams |
| 5,976,740 A | 11/1999 | Ausschnitt et al. |
| 5,981,119 A | 11/1999 | Adams |
| 5,985,495 A | 11/1999 | Okumura et al. |
| 6,003,223 A | 12/1999 | Hagen et al. |
| 6,004,706 A | 12/1999 | Ausschnitt et al. |
| 6,020,966 A | 2/2000 | Ausschnitt et al. |
| 6,027,842 A | 2/2000 | Ausschnitt et al. |
| 6,042,976 A | 3/2000 | Chiang et al. |
| 6,061,119 A | 5/2000 | Ota |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,183,919 B1 | 2/2001 | Ausschnitt et al. |
| 6,259,094 B1 * | 7/2001 | Nagai et al. ................. 250/310 |
| 6,317,211 B1 | 11/2001 | Ausschnitt et al. |
| 6,335,151 B1 | 1/2002 | Ausschnitt et al. |
| 6,346,979 B1 | 2/2002 | Ausschnitt et al. |
| 6,350,548 B1 | 2/2002 | Leidy et al. |
| 6,417,929 B1 | 7/2002 | Ausschnitt et al. |
| 6,429,667 B1 | 8/2002 | Ausschnitt et al. |
| 6,457,169 B1 | 9/2002 | Ross |
| 6,460,265 B2 | 10/2002 | Pogge et al. |
| 6,612,159 B1 | 9/2003 | Knutrud |
| 6,638,671 B2 | 10/2003 | Ausschnitt et al. |
| 6,766,211 B1 | 7/2004 | Ausschnitt |
| 6,803,995 B2 | 10/2004 | Ausschnitt |
| 6,842,237 B2 | 1/2005 | Ausschnitt et al. |
| 6,869,739 B1 | 3/2005 | Ausschnitt et al. |
| 6,879,400 B2 | 4/2005 | Ausschnitt et al. |
| 6,898,005 B2 * | 5/2005 | Kusaka et al. ............... 359/388 |
| 6,937,337 B2 | 8/2005 | Ausschnitt et al. |
| 6,975,398 B2 | 12/2005 | Ausschnitt et al. |
| 7,042,551 B2 | 5/2006 | Ausschnitt |
| 2001/0001900 A1 | 5/2001 | Pogge et al. |
| 2002/0021434 A1 * | 2/2002 | Nomura et al. ................. 355/55 |
| 2002/0097399 A1 | 7/2002 | Ausschnitt et al. |
| 2003/0053057 A1 | 3/2003 | Mishima |
| 2003/0184736 A1 * | 10/2003 | Fukuhara et al. ............ 356/124 |
| 2006/0289751 A1 * | 12/2006 | Watanabe et al. ........... 250/310 |
| 2007/0280559 A1 * | 12/2007 | Ishitani et al. .............. 382/299 |

FOREIGN PATENT DOCUMENTS

| | | |
|---|---|---|
| JP | 61-170032 | 7/1986 |
| JP | 2-260441 | 10/1990 |
| JP | 10-213895 | 8/1998 |
| WO | WO02/19415 | 3/2002 |

OTHER PUBLICATIONS

"Method for Measuring Semiconductor Lithographic Tool Focus and Exposure", IBM Technical Disclosure Bulletin, Jul. 1987, 2 pages.
Ausschnitt, Christopher P., Cheng, Shaunee Y.; "Modeling for Profile-Based Process- Window Metrology" , SPIE5378-5, Feb. 26, 2004, pp. 1-6.

* cited by examiner

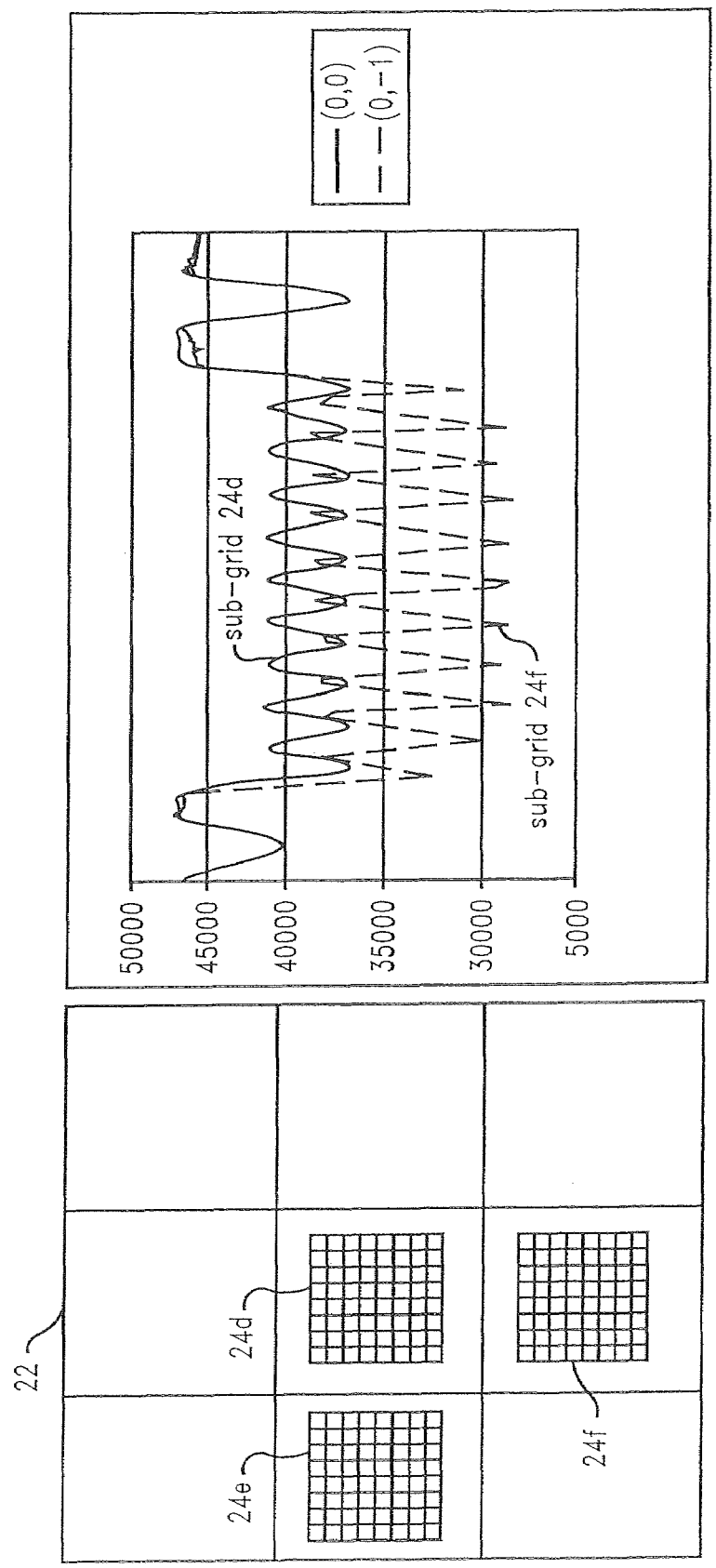

OVERLAY TARGET AND MEASUREMENT METHOD USING REFERENCE AND SUB-GRIDS

FIELD OF THE INVENTION

The present invention relates generally to semiconductor manufacturing and, more particularly, to overlay measurement targets and methods for controlling the alignment error among different pattern layers and among different patterns on the same layer of a semiconductor wafer stack.

BACKGROUND OF THE INVENTION

New metrology measurement and lithography control methodologies for overlay control of integrated circuit fields within and between circuit layers made by a lithographic process are described in U.S. Pat. No. 5,877,861. As described therein, exposure tools known as steppers print multiple integrated circuit patterns or fields (also known as product cells) by lithographic methods on successive layers of a semiconductor wafer. These steppers typically pattern different layers by applying step and repeat lithographic exposure or step and scan lithographic exposure in which the full area of the wafer is patterned by sequential exposure of the stepper fields containing one or more integrated circuits. The stepper achieves registration among pattern layers by aligning the current layer to a previously patterned layer.

Overlay measurement determines the relative positioning errors among patterns on the same or different layers subsequent to the lithographic patterning process. Overlay measurement is critical to achieving the nanometer-scale positioning of patterns across multiple process layers necessary for advanced semiconductor manufacturing. Successful overlay refers to condition where the relative locations of patterns throughout the sequence of manufactured layers that comprise the finished circuit correspond to the desired circuit design within allowed tolerances. Currently, overlay measurement is performed using targets comprised of nested sub-patterns printed together with the functional circuit elements at each successive lithographic step. Images of the overlay targets are captured by an imaging system. Algorithms applied to the captured images extract the relative displacement of the nested sub-patterns. The resulting overlay error is typically expressed as the vector sum of the (x, y) components of the relative displacement.

In the most common overlay target designs the sub-patterns are square; often referred to as "box-in-box," "frame-in-frame" or "bar-in-bar" targets. A frame-in-frame example is shown in FIG. 1. By convention the target is comprised of an outer "reference" sub-pattern 1a and an inner "post" sub-pattern 1b, where the post sub-pattern is printed after the reference sub-pattern. The overlay error is defined as the displacement of the post sub-pattern relative to the reference sub-pattern. Nesting among more than two square sub-patterns to accommodate more than one pair of layers has been disclosed by Leidy et al. in U.S. Pat. No. 6,350,548.

Designs and analysis methods for overlay targets based on various array sub-patterns, consisting of periodic pattern elements, have also been disclosed. For example, Ross et al. in U.S. Pat. Nos. 6,061,606 and 6,457,169 discloses using the phase shift between adjacent circuit and circuit-like arrays as an overlay metric. Ausschnitt in U.S. patent application Ser. No. 09/678,634 discloses interleaved arrays of slightly different spatial frequency to produce a synthetic beat signal that amplifies the measurable effect of overlay error. Adel et. al., in International Publication Number WO 02/19415 discloses diagonally opposed and spatially offset arrays measurable by the pattern phase shift in a manner similar to that described by Ross.

The ideal overlay target must be optimized over various constraints: 1) To maximize the productive space on each manufactured wafer (the area occupied by functional circuit elements) the overlay target must be as small as possible. 2) To maximize overlay measurement capability, the sub-patterns that comprise the overlay target must be as large and dense as possible, having nearly equal size and density among all sub-patterns. 3) To minimize image interference effects, the sub-patters must be as widely separated as possible. 4) To minimize tool induced shift (TIS) effects, the target must enable compensation for errors introduced by the imaging system distortion across the image field of view (FOV). 5) To minimize measurement time, the overlay target must enable simultaneous measurement among multiple sub-pattern pairs. 6) To eliminate error in associating the sub-pattern pairs with the correct process layers and exposure fields, each sub-pattern must have a unique identifier. 7) To optimize alignment control, the overlay target nesting must be tailored to the product alignment tree (in which each branch is the sequence of layers that align to a common reference layer). 8) To ensure robust imaging and process insensitivity, the sub-patterns must be compatible with the ground-rules of the layers on which they are printed.

While the overlay targets described by the prior art individually meet some of the above criteria, there is still a need for an overlay target that is optimized over the full set of constraints.

SUMMARY OF THE INVENTION

Bearing in mind the problems and deficiencies of the prior art, it is therefore an object of the present invention to provide an overlay target that is compact, exhibits sub-nanometer measurement precision on commercially available metrology tools, leverages high pattern density and isolated sub-pattern images, enables in situ compensation for imaging system distortion, enables the simultaneous capture and measurement of multiple sub-pattern images, encodes each sub-pattern with a machine-readable identifier, can match sub-pattern groups to the alignment tree of the functional circuit being manufactured and can be tailored to the ground-rules of the layers on which it is printed.

It is another object of the present invention to provide a method of analyzing the images captured from the inventive overlay target.

The above and other objects, which will be apparent to those skilled in art, are achieved in the present invention which is directed to a target system for determining alignment error in electronic substrates comprising a first contrasting set of elements forming a first grid pattern having a distance between elements, with the first grid pattern having a plurality of grid segments in at least one of the x and y directions. The target system also includes at least one second contrasting set of elements forming a second grid pattern having a distance between elements, with the second grid pattern having a plurality of grid segments in the x and y directions. The distance between the second set of elements is less than the distance between the first set of elements, and the second grid pattern is disposed within one of the first grid pattern segments. Alignment error may be determined by measuring distance between the first and second set of elements in the first and second grid patterns.

Preferably, the first grid pattern has a plurality of grid segments in both the x and y directions and the target system includes a plurality of second grid patterns, with each of the second grid patterns being disposed within different segments of the first grid pattern. Each of the second grid patterns may have the same or a different distance between the second sets of elements therein. The first and second sets of contrasting elements may be etched in a layer on a lithographically produced substrate; the second set of contrasting elements may also be formed in a resist layer on a lithographically produced substrate.

The grid segments formed by the first and second grid patterns may comprise an array of rectilinear, and preferably, nominally square, frames, each frame having x and y dimensions equal to the distance between elements in the first and second sets of elements. A pattern recognition feature may be associated with one of the frames of the first grid pattern. The elements in the first and second grid patterns may be continuous lines, discontinuous lines, parallel lines, or aligned points.

The first and second grid patterns may be formed on the same or different lithographic layers of an electronic substrate, and where a plurality second grid patterns are used, they may each be formed on different lithographic layers of an electronic substrate.

When the target system is used with an optical imaging system having a light source of wavelength λ, numerical aperture NA, and a partial coherence σ, the second set of elements in the second grid pattern has period p, corresponding to the distance between the second set of elements, defined by the expression:

$$p \geq \lambda/(NA(1+\sigma)).$$

More preferably, the second grid pattern period p is defined by the expression:

$$p/2 < \lambda/(NA(1+\sigma)) < p.$$

Another aspect of the present invention is directed to a method for determining alignment error in electronic substrates comprising providing on a layer of a substrate a first contrasting set of elements forming a first grid pattern having a distance between elements; the first grid pattern having a plurality of grid segments in at least one of the x and y directions. The method also includes providing nested within at least one of the first grid pattern segments, on the same or different layer of a substrate, a second contrasting set of elements forming a second grid pattern having a distance between elements, the second grid pattern having a plurality of grid segments in the x and y directions. The distance between the second set of elements is less than the distance between the first set of elements. The method then includes measuring location of the first set of elements in the first grid pattern and determining the center of the first set of elements in the first grid pattern. The method further includes measuring location of the second set of elements in the second grid pattern and determining the center of the second set of elements in the second grid pattern. The method then comprises comparing the center of the first set of elements and the center of the second set of elements and determining alignment error of the first and second grid patterns.

Preferably, measurement of location of the first and second sets of elements in the first and second grid patterns is by scanning with an energy beam in a line across the first and second grid patterns and determining a reflection intensity pattern that signifies location of the first and second sets of elements in the first and second grid patterns.

The determination of the centers of the first and second set of elements in the first and second grid patterns may be by digitizing the location-signifying reflection intensity pattern with a predetermined pixel size. The comparison of the centers of the first and second sets of elements may be calculated using pixel size of the centers of the of the first and second sets of elements.

Where the second contrasting set of elements forms a second grid pattern on the same, first substrate layer as the first grid pattern, the method may further include forming on a subsequent, second layer of the substrate another second grid pattern with second contrasting set of elements nested within a different first grid pattern segment. The first and second grids pattern on the first substrate layer are visible through the second substrate layer. The method continues by scanning with an energy beam in a line across the first and second grid patterns created on the first substrate layer and determining a reflection intensity pattern that signifies location of the first and second sets of elements therein. The method also includes scanning with an energy beam in a line across the first grid patterns on the first substrate layer and the second grid pattern created on the second substrate layer and determining a reflection intensity pattern that signifies location of the sets of elements therein. The method then aligns the reflected intensity pattern of the second sets of elements in the second grid pattern created on the first substrate layer and in the second grid pattern created on the second substrate layer. Using the reflected intensity patterns, the method then determines the centers of the first and second sets of elements in the first and second grid patterns on the first and second substrate layers. Subsequently, the method then compares the centers of each of the second set of elements in the second grid patterns on the first and second substrate layers with the centers of the first set of elements of the first grid pattern segment in which it is nested and determining alignment error.

In a further aspect, the present invention is directed to a metrology tool system comprising a plurality of metrology tools. Each metrology tool comprises a stage for securing a lithographically produced semiconductor substrate, an energy source, a lens for directing the energy source onto a surface of the substrate, a lens for capturing an image of a structure lithographically produced on the substrate, and an image processor for measuring distance between points on the image of the lithographically-produced structure on the substrate. Additionally, each metrology tool stage includes an alignment target affixed thereto comprising a contrasting set of elements forming a grid pattern having a plurality of grid segments in the at least one of the x and y directions, each grid segment having a distance between elements equal to the same period. Each metrology tool is adapted to be calibrated by measuring the period of the grid segments in the grid pattern on the alignment target associated affixed to the tool stage.

Preferably, the grid pattern employed on each alignment target has a plurality of grid segments in both the x and y directions. More preferably, the grid segments formed by the grid pattern comprise an array of rectilinear frames, such as square frames, with each frame having x and y dimensions equal to the distance between elements in the set of elements.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 11 is a top plan view of the target of FIG. 5 rotated 90°, with the placement of an additional sub-grid within a reference grid frame at a subsequent lithographic level.

FIG. 12 is a graphical representation of showing the aligned integrated scanned images of the two sub-grid lines of FIG. 9, scanned in the x-direction.

DESCRIPTION OF THE PREFERRED EMBODIMENT(S)

In describing the preferred embodiment of the present invention, reference will be made herein to FIGS. 2-14 of the drawings in which like numerals refer to like features of the invention.

Figure 2:
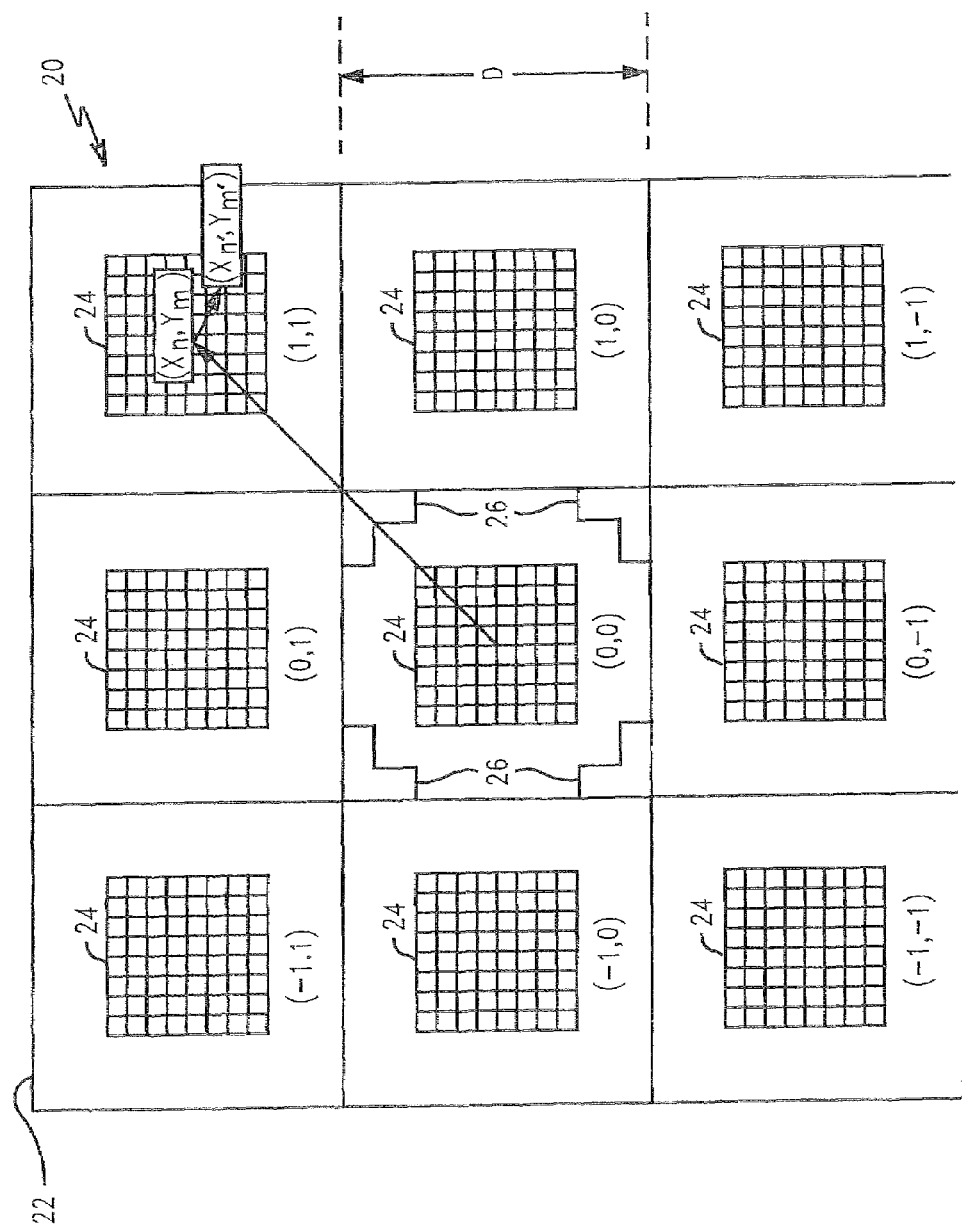
FIG. 2 is a top plan view of the target system of the present invention comprising sub-grids nested within a reference grid on a plurality of lithographically produced layers of a semiconductor wafer.

An example of the overlay target of the present invention is shown in FIG. 2. The overlay target 20 is comprised of nested grid patterns, with an outer pattern 22 as the reference grid and a plurality of sub-patterns 24 as the sub-grids. The area of the reference grid portion of the overlay target is divided into an N×M array of preferably equal area grid sections, called frames, delineated by a reference grid pattern of period D printed at the first layer of the patterning sequence. The reference grid comprises at least one row of linked frames, i.e., a plurality of grid segments in at least one of the x- and y-directions, so that N is equal to or greater than one and M is greater than one. Preferably, the array has a plurality of grid segments in both the x- and y-directions, so that N and M are integers both greater than 1. The reference grid segments or frames are preferably rectangular, and, more preferably, square. Each frame location on the reference grid is identified by the array address (n, m).

Either simultaneous with or subsequent to the printing of the reference grid 22, a sub-grid pattern 24 of period p, where p<<D, is printed, nominally centered in the reference grid frame. In the preferred embodiment, the first sub-grid, called the "reference" sub-grid, is printed simultaneously with the reference grid and is centrally located in the reference grid. All subsequently printed sub-grids 24, called "post" sub-grids, are placed within frames surrounding the reference sub-grid. Each sub-grid is comprised of (x, y) oriented features forming a regular N'×M' sub-array whose period p within the resolution capability of the metrology tool, where N' and M' are integers greater than 1. Each location within a sub-grid is identified by the array address (n', m').

Both the reference grid and the sub-grids may be developed in a resist layer on, or etched into the surface of, a layer on the semiconductor wafer. If a reference grid or a sub-grid is to be compared to one or more sub-grids on subsequently produced lithographic layers, etching must be used.

Figure 1:
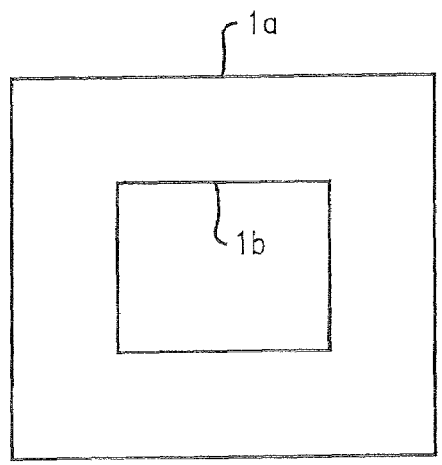
FIG. 1 is a top plan view of a frame-in-frame target employed in the prior art.
Figures 3A, 3B, 3C:
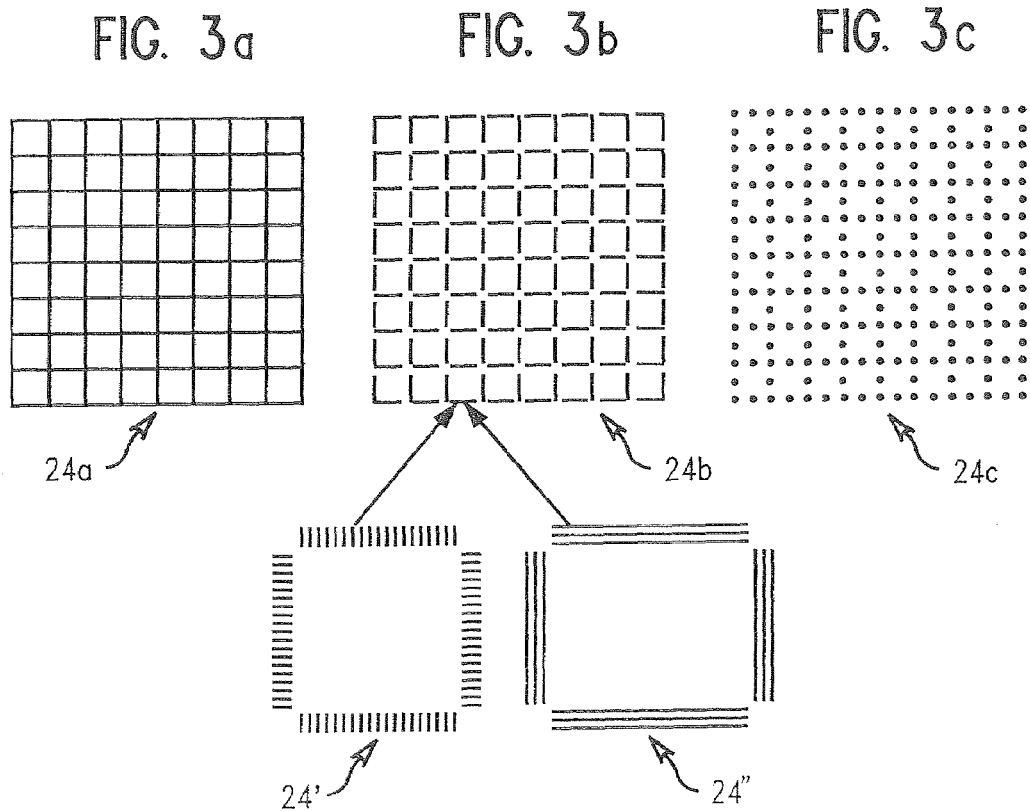
FIGS. 3a, 3b and 3c are top plan views of different elements that may be used to form the sub-grids of FIG. 2.

The preferred embodiment of the target of the present invention shown in FIG. 2. is comprised of a 3×3 array of reference grid and 8×8 array of sub-grids. Centrally located at frame address (0,0) is a reference sub-grid 24 printed simultaneously with the reference grid 22. Around the reference sub-grid are eight equally spaced post sub-grids 24 printed at simultaneous or subsequent lithography steps. The lithography steps that print a sub-grid can be at the same layer or different layers of the manufacturing process as any other sub-grid. Each sub-grid is designed to be centered within the frame of a reference grid of known major period D. The sub-grids may be arrays of horizontally and vertically oriented features (e.g., lines or spaces, line or space segments, or contact holes to maintain compatibility with the layer groundrules) at a known minor period p that can be resolved by the imaging tool, but is much smaller than D. Examples of the elements that may be used to form the sub-grids, or the reference grids, are shown in FIGS. 3a, 3b and 3c. In FIG. 3a, sub-grid 24a is comprised of solid lines (or spaces on a solid background) that intersect to form the individual subframes in an 8×8 array. In FIG. 3b, sub-grid 24b is composed of lines or spaces that do not intersect, yet still form the substantial outlines of the subframes. The lines or spaces of that make up the elements of sub-grid 24b (or sub-grid 24a) may themselves be arrays of equally spaced parallel lines oriented either parallel (24") or perpendicular (24') to the direction of the element. As shown in FIG. 24c, the elements may be composed of holes to form the array.

For optical imaging systems, the minimum resolvable period is given by:

$$p_{min} = \frac{\lambda}{NA(1+\sigma)} \quad (1)$$

where λ is the wavelength, NA is the numerical aperture and σ is the partial coherence of the imaging system. To ensure that the image of each sub-grid is sinusoidal in intensity the constraint on the sub-grid period p is:

$$\frac{p}{2} < p_{min} < p << D \quad (2)$$

The overlay target may also include centrally located pattern recognition features 26 to enable precise positioning of the target in the imaging system FOV.

Figure 4:
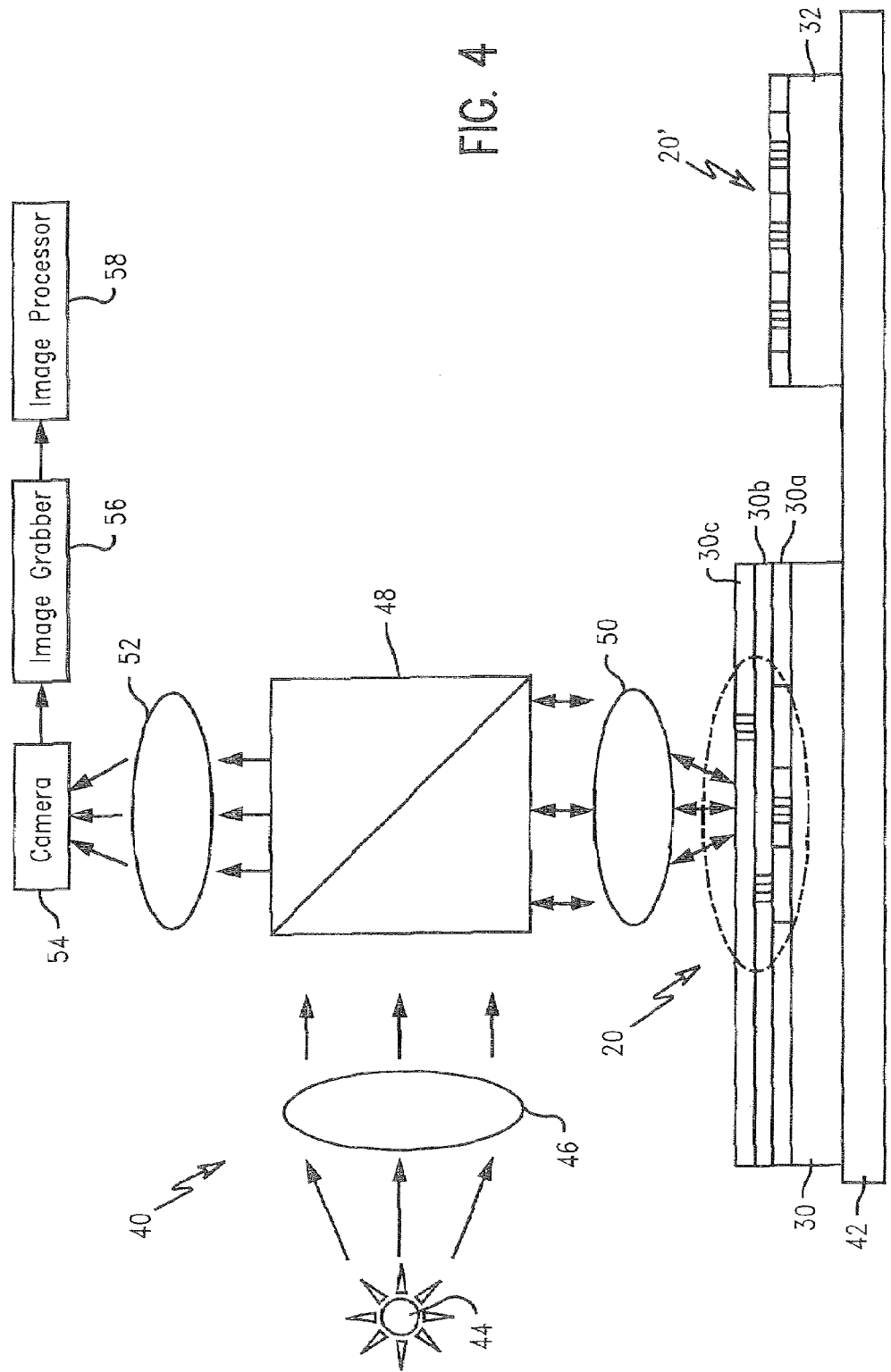
FIG. 4 is a side view of a schematic of a optical overlay metrology tool with the target system of the present invention.

A schematic view of an optical overlay metrology tool 40 to be used in conjunction with the present invention is shown in FIG. 4. Illumination from a broadband radiation source 44 is projected via a collimating lens 46 to a beam-splitter 48 where it is reflected 90° through object lens 50 onto the overlay target 20. As shown, target 20 is printed by etching into three separate, consecutive lithographically produced layers 30a, 30b and 30c on semiconductor wafer substrate 30 secured to stage 42. The reference grid is printed on lower layer 30a, one sub-grid is printed on middle layer 30b within a reference frame, and a second sub-grid is printed on upper layer 30c within another reference frame, such that the reference grid and two sub-grids of the target are visible when viewed from the top. The light reflected from the target is then passed back through object lens 50, straight up through beam splitter 48 and image lens 52 where it is imaged onto a detector array of camera 54, such as a CCD, having a uniform pixel size c. The imaging lens 52 magnifies the target image by a factor M to ensure Mp>>c. An image grabber 56 captures the magnified image of each target within the optical field of view, typically a 512×512 array of detector pixels. An image processor 58 then analyzes the pixilated image to extract the overlay error of one section of the target relative to another.

Figure 5:
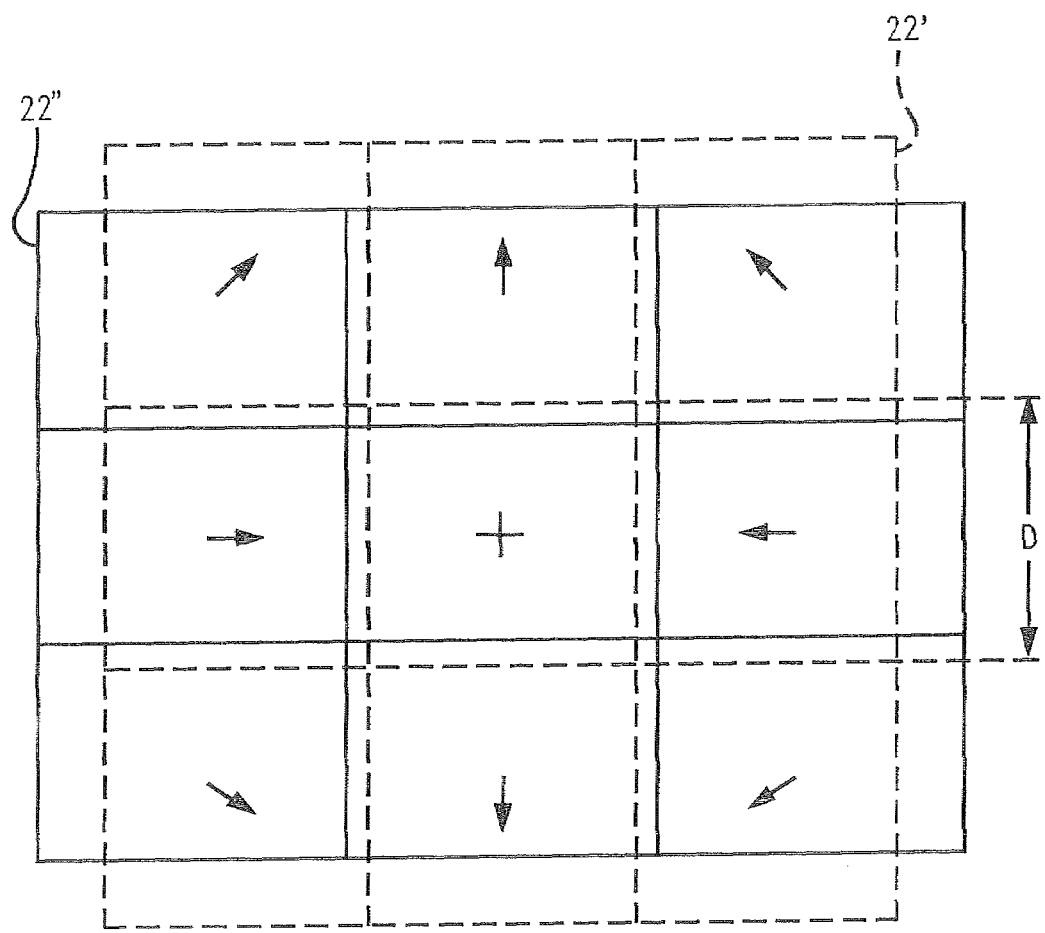
FIG. 5 is a top plan view showing distortion measurement employing the reference grids in the target system of the present invention.
Figure 6:
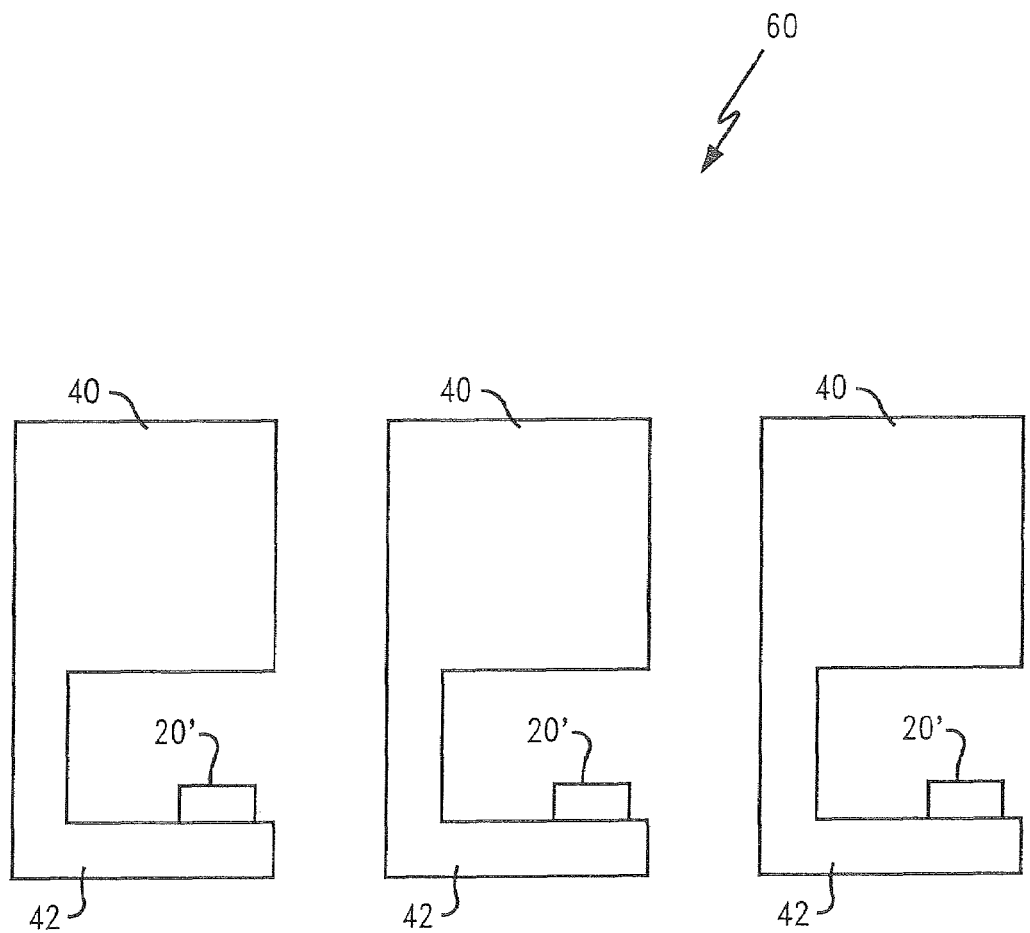
FIG. 6 is a schematic of a metrology tool system having a plurality of metrology tools, each having affixed to the stage an artifact target of the present invention.

The target of the present invention may be composed in a variety of reference and sub-grid configurations depending on the application. One application may be for metrology tool calibration. A metrology tool image can be distorted due to imaging lens aberrations and camera pixel asymmetries and placement errors. Calibration and compensation for the metrology error introduced by these fixed image distortions, requires an artifact target 20' printed on substrate 32 (FIG. 4), representing zero overlay error across the FOV, comprised of the reference grid and all sub-grids printed simultaneously on a single layer. Pre-characterization and tool matching entails conventional techniques of collecting a set of target images at different orientations (notably, 0, 90, 180 and 270 degrees) to determine image placement corrections relative to the major and minor periods of the target, D and p. The corrections are expressed as the vectors required to return the distorted image grids to the design grids. These are separable into the set of reference grid corrections ($\delta X_n$, $\delta Y_m$) that correct distortions in the imaged frame locations ($X_n$, $Y_m$) and the sets of sub-grid corrections ($\delta x_{n'}$, $Sy_{m'}$) that correct the distortions in the imaged locations within each sub-grid ($x_{n'}$, $y_{m'}$). The total correction at any address (m, n, m', n') within the overall target is then the sum of the two vectors representing that location. An example of reference grid corrections ($\delta X_n$, $\delta Y_m$) for the case of an imaging system exhibiting anisotropic magnification distortion is shown in FIG. 5, where an ideal reference grid 22' is compared to a distorted actual reference grid 22". The net result of applying metrology tool specific image corrections relative to a common artifact target is that each tool in a corrected set of tools will produce distortion free images of the target that match from tool-to-tool. In a metrology tool system 60 comprising a plurality of metrology tools 40, as shown in FIG. 6, replications of an ideal reference grid on each artifact target 20', permanently mounted on the stage 42 of each of the metrology tools (as also shown in FIG. 4), facilitate periodic recalibration of the tools in the system.

Another application may be in layer-to-layer overlay measurement, between more than one lithographically produced layer. Conventional overlay metrology is performed between two layers in an alignment sequence. The target system of the present invention enables measurement among a group of layers that comprise an alignment sequence. The target layout can be tailored to the alignment sequence. For the set of films characteristic of the so-called "front-end" processing of a CMOS chip, a typical allocation for the 9 addresses corresponding to the target illustrated in FIG. 2 would be as shown in Table 1:

TABLE 1

| Reference Grid Address | Layer | Sub-grid Period |
| --- | --- | --- |
| (0, 0) | Isolation | $p_1$ |
| (1, 0) | Gate | $p_2$ |
| (0, 1) | Contact | $p_3$ |
| (1, 1) | Metal | $p_4$ |
| (−1, 1), (−1, 0), (−1, −1), (0, −1), (1, −1) | 5 Implants | $p_{5\text{-}9}$ |

The isolation, gate, contact, metal and implants are each disposed in different layers on the substrate.

A further application is within layer and layer-to-layer overlay measurement. There may be a need to control both the layer-to-layer (field) and within-layer (stitched) contributions to pattern placement error. The same target of FIG. 2 could accommodate this strategy for overlay metrology among the critical layers of the front-end process as shown in Table 2:

TABLE 2

| Reference Grid Address | Layer | Sub-grid Period |
| --- | --- | --- |
| (0, 0), (0, 1) | Isolation (field, stitched) | $p_{1,2}$ |
| (1, 0), (1, 1) | Gate (field, stitched) | $p_{3,4}$ |
| (−1, 0), (−1, 1) | Contact (field, stitched) | $p_{5,6}$ |
| (0, −1), (−1, −1) | Metal (field, stitched) | $p_{7,8}$ |
| (1, −1) | Implants | $p_9$ |

A single address can accommodate multiple implants since they typically do not leave a lasting pattern after resist removal.

In a typical application, the overlay targets are placed near the four corners of an exposure field, and the area is patterned in a single lithographic step. For ease of layout it is common to rotate the targets through 0, 90, 180, and 270 degree orientations. With the exception of the centrally located reference sub-grid, the associations between frame address and layer changes with the orientation of the target. In the preferred embodiment of the target system design, each layer would be assigned an unique sub-grid period $p_i$, as shown in the above tables, in decreasing steps $\Delta p = p_i - p_{i+}$, relative to the period of the reference sub-grid. Typical values of $\Delta p$ are 10-50 nanometers. The period to layer association is independent of target orientation. The period is a machine-readable identifier associated with each layer, as will be explained further below.

Figure 7:
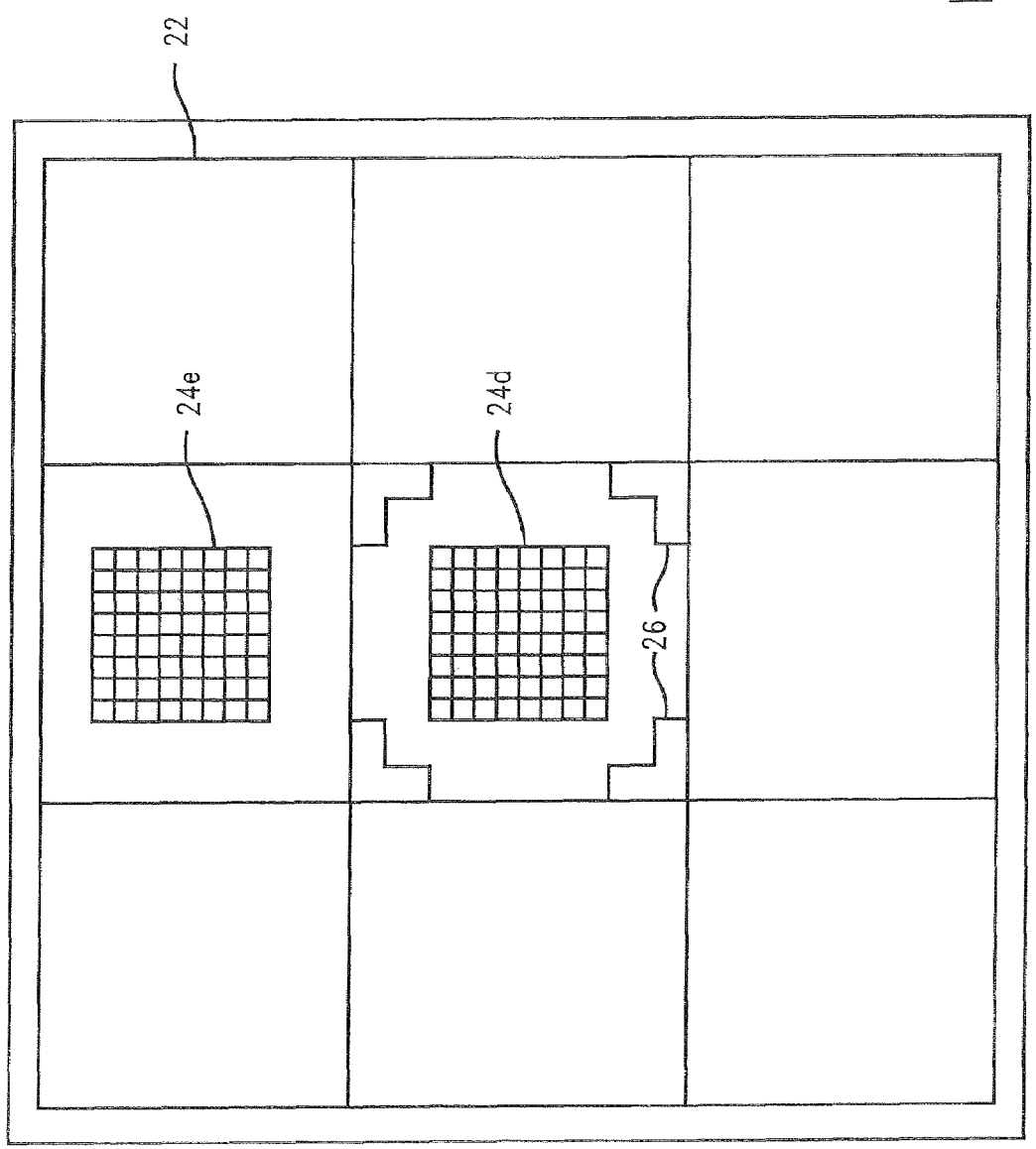
FIG. 7 is a top plan view showing the use of sub-grids, on two different lithographic layers and nested within a reference grid, to measure overlay error.
Figure 8:
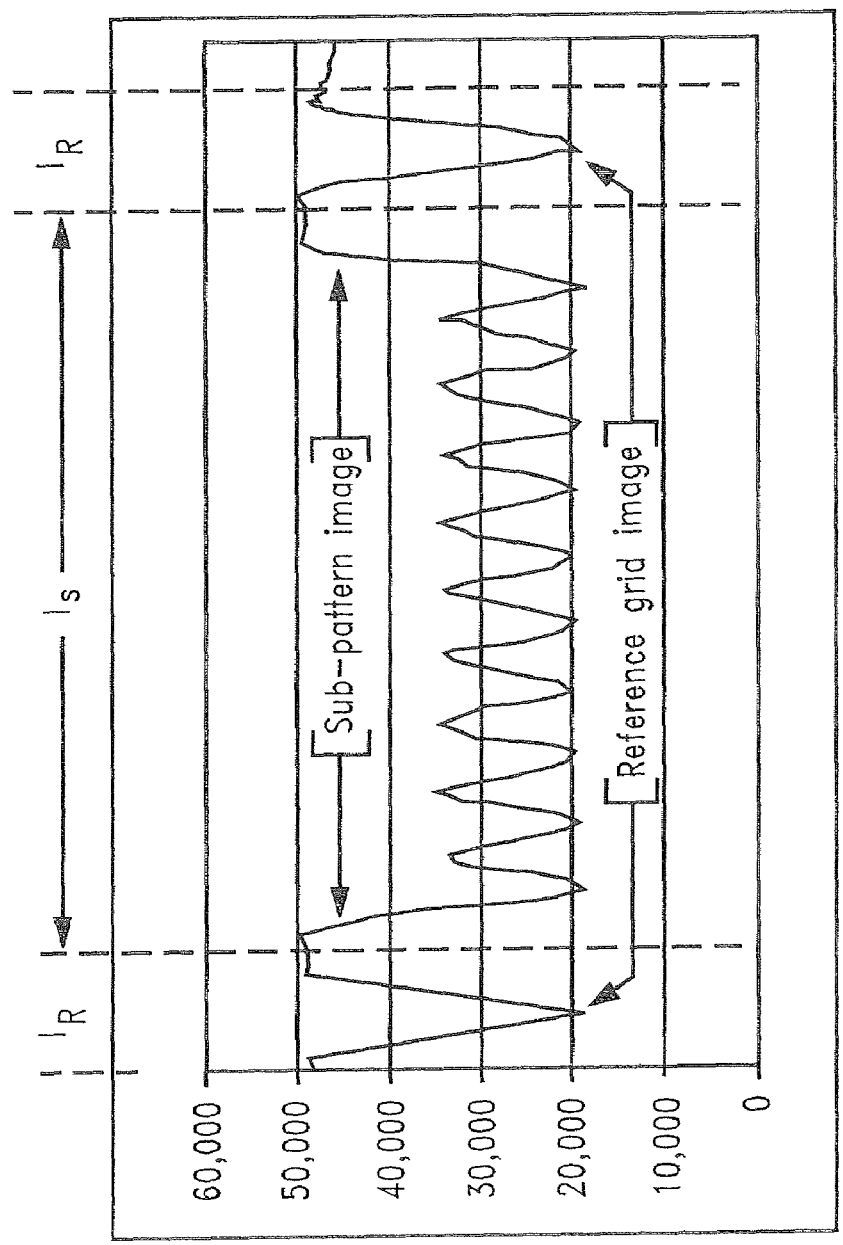
FIG. 8 is a graphical representation of the integrated scanned image of the printed lines of a single sub-grid within a reference grid frame in the target of FIG. 5.

An image of the printed reference grid and sub-grids of an embodiment of the inventive overlay target is shown in FIG. 7, there is shown two reference sub-grids 24d, 24e nested between the center and upper center frames of reference grid 22. The periods of the target are D=16 μm and $p_1$=1.25 μm, such that the N×M=3×3 reference grid fits within a 50 μm square FOV and a N'×M' 9×9 sub-grid fits within the 16 μm square area of each pattern section. The superimposed x-direction integrated signal traces of the multiple sub-grid targets 24d, 24e are shown in FIG. 8. As indicated in FIG. 8, the signals can be divided into two regions: the isolated and well-resolved signal $I_R$ generated by the reference grid 22 and the for the most part sinusoidal signal $I_S$ generated by the sub-grids 24d, 24e. The image and signal of FIGS. 7 and 8 were collected using the Accent Optical Technologies Caliper metrology tool. The illumination wavelength is centered at approximately 550 nm, NA=0.5 and σ=0.5, so that the minimum resolvable grid period is ~0.7 µm, which meets the criteria of Equation (2) for periods in the range 0.7 to 1.4 µm. In the preferred embodiment, the period is closer to the maximum allowed (p≦2 $p_{min}$) to ensure adequate image contrast.

Figure 9:
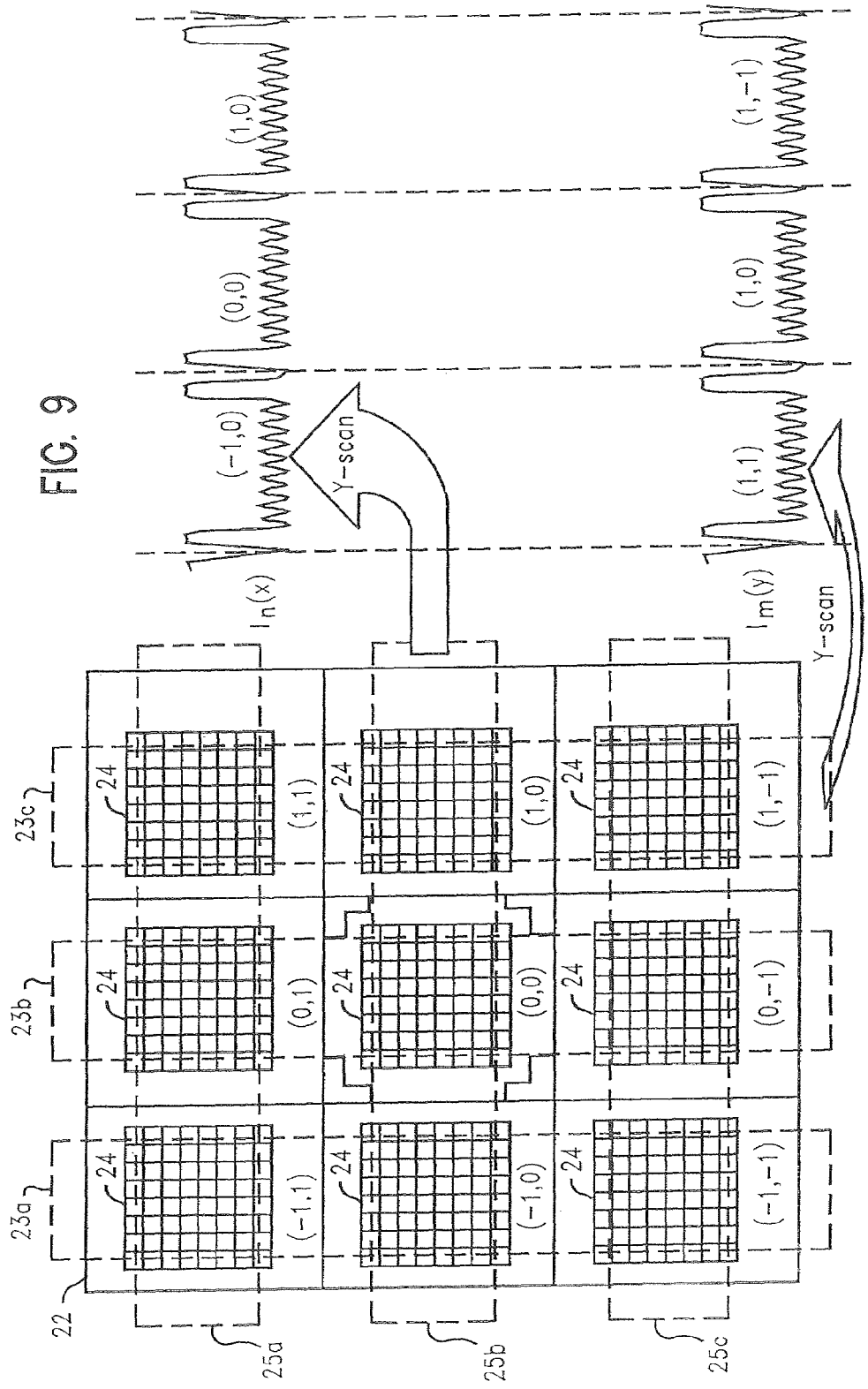
FIG. 9 shows on the left a top plan view of sub-grids nested within the frames of a reference grid target of the present invention, and on the right shows graphical representations of the integrated scanned images of the nested reference and sub-grid lines scanned across the center three reference frames in the x-direction (top right) and the integrated scanned images of the nested reference and sub-grid lines scanned across' the right three reference frames in the y-direction (bottom right).

Several possible methods can be implemented in the image processor of FIG. 4 to extract the overlay error between any pair of sub-grids in the target image. One method is to generate x-direction and y-direction integrated intensity signals by summing the image intensity over gates spanning the target in N horizontal and M vertical regions that distinguish the rows and columns of target frames. The $I_n(x)$ and $I_m(y)$ results for a target fully populated by sub-grids are shown schematically in FIG. 9 in the case of a 3×3 frame target. The left portion of FIG. 9 shows 8×8 sub-grids 24 nested within the frames of a 3×3 reference grid target 22. The reference grid is segmented into groups of three frames in each of the x- and y-directions, so that scans may be made of the sub-grids nested therein. X-direction scans may be made of the frames and sub-grids in groups 23a, 23b and 23c, and y-direction scans may be made of the frames and sub-grids in groups 25a, 25b and 25c. On the top right side of FIG. 9 there is shown a graphical representation of the integrated scanned images of the nested reference and sub-grid lines scanned across the x-direction group 25b, and on the lower right side there is shown a graphical representation of the integrated scanned images of the nested reference and sub-grid lines scanned across the y-direction group 23c. Similar scanned images may be generated for the remaining x- and y-direction scan groups.

Figure 10:
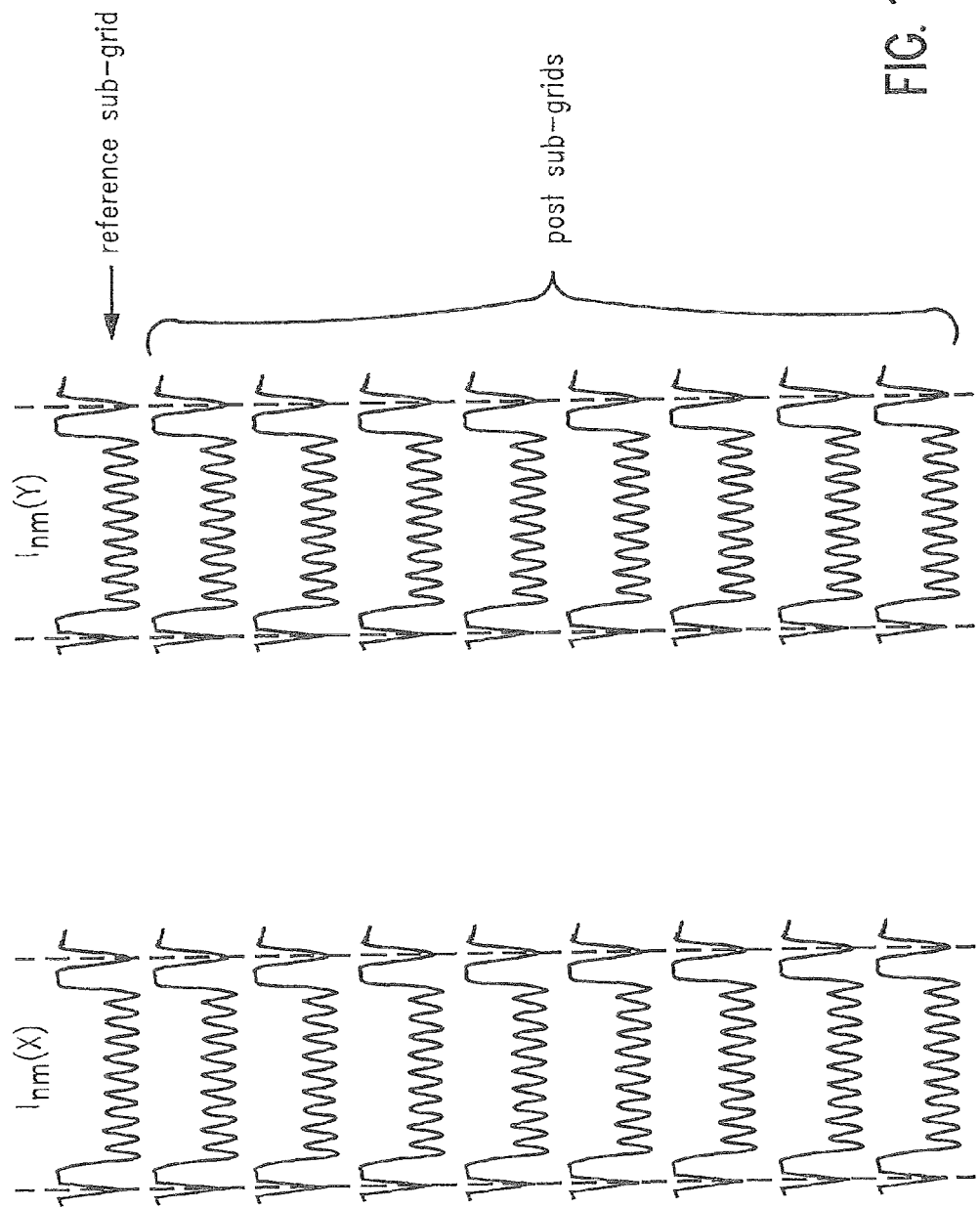
FIG. 10 is a graphical representation showing on the left the alignment of the images of the nested reference and sub-grid lines of FIG. 7, as scanned in the x-direction, and showing on the right the alignment of the images of the nested reference and sub-grid lines of FIG. 9, as scanned in the y-direction.

The resulting groups of sub-grid signals per each row and column are further dissected into individual target frame scans grouped by x and y orientations, as shown in FIG. 10, where the sets of frames are aligned to each other positioning each frame to superimpose the reference grid signals in the $I_R$ signal regions. The alignment removes the effect of any rotation error due to imperfect wafer and stage positioning as well as residual distortion errors to ensure that every post sub-grid now resides in the same (x, y) coordinate system as the reference sub-grid. FIGS. 9 and 10 illustrate the case where the target is populated by identical sub-grids placed simultaneously at the same layer.

An example comparing two distinct sub-grids at different process layers is shown in FIGS. 11 and 12. FIG. 12 shows an image of the target of FIG. 7 rotated 90 degrees, where a post sub-grid has been printed in the (0, −1) frame on a different layer by a subsequent lithography step. For the example illustrated, the reference grid 22 and sub-grid 24d are printed at the isolation layer and the post sub-grid 24f is printed at the gate layer. The x-direction intensity signals obtained by integrating the detected intensity over the y dimension of the sub-grid and surrounding reference grid frame are shown in FIG. 11. The periods of the two sub-grids 24d, 24f differ by 50 mm, introducing an observable phase shift between the gate and isolation signals as the sub-grids are traversed. For the case shown, the isolation sub-grid 24d is a 9×9 array of period $p_1$=1.25 µm and the gate sub-grid 24f is a 10×10 array of period $p_2$=1.2 µm. The gate layer sub-grid 24f is aligned to the isolation layer sub-grid 24d by superimposing the reference grid signals in the $I_R$ signal regions.

Figure 13:
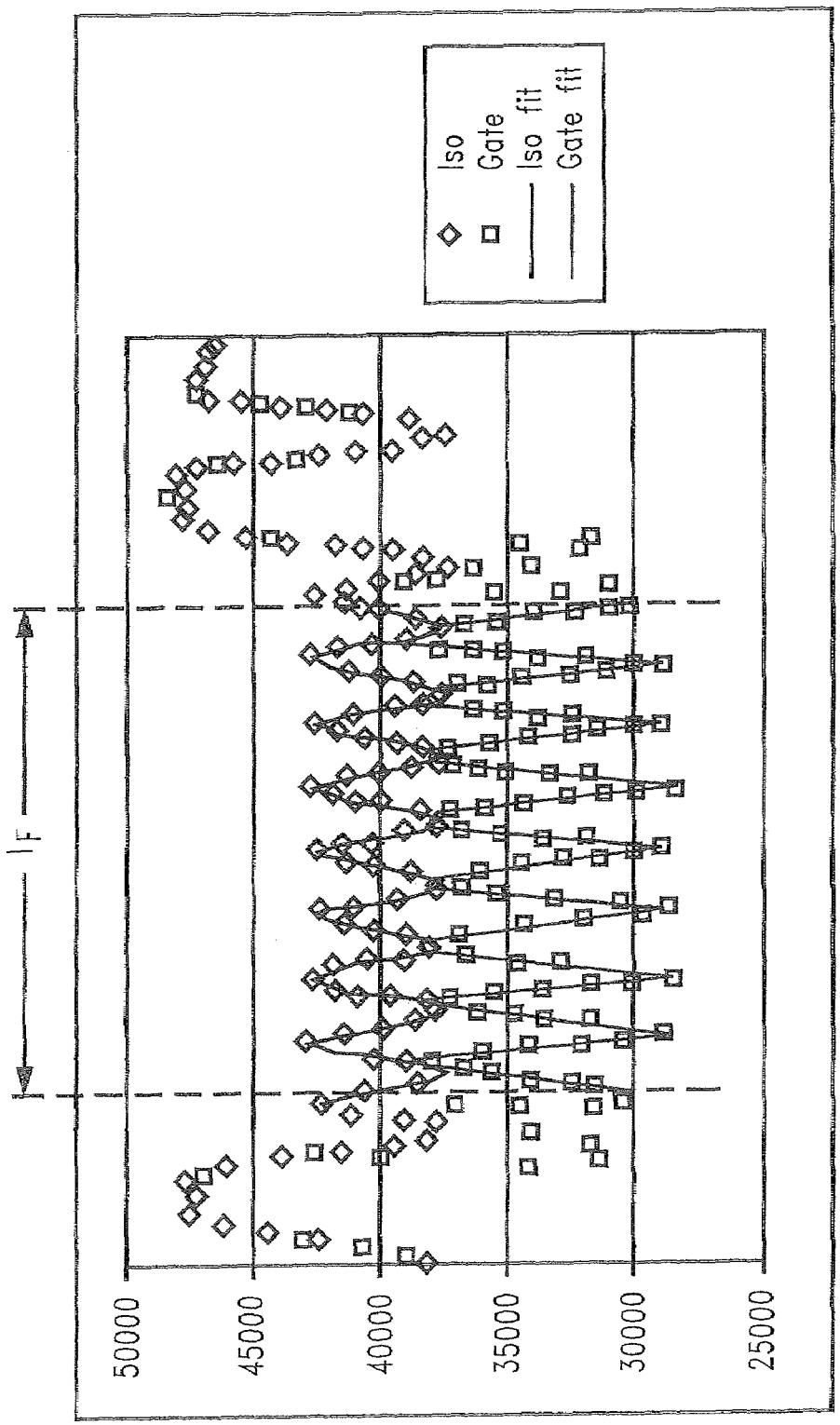
FIG. 13 is a graphical representation of a least-squares fit to an integrated signal of two different sub-grids of a target of the present invention.

Following alignment of the frames, the variations of the sub-grids are least-squares fit to a model of the form:

$$I_i(x) = A_i + B_i \cos\left(\frac{2\pi}{d_i}(x - s_i)\right) \quad (3)$$

using (A, B, d, s) as parameters of fit over the applicable signal region $I_F(x)$ within the region $I_S(x)$, as shown in FIG. 13. The parameters (d, s) are expressed as numbers of pixels in the digitized image, where the pixel size c is related to the known periods by:

$$c_i = d_i p_i$$

The measured overlay error Δx between any pair of sub-grids and the measurement uncertainty due to pixel size $\epsilon_{pxl}$ are then given by:

$$\Delta x = \left(\frac{c_1 + c_2}{2}\right)(s_1 - s_2) \quad (4)$$

$$\varepsilon_{pxl} = \left(\frac{c_1 - c_2}{2}\right)(s_1 - s_2) \quad (5)$$

The correspondence of any sub-grid to a process layer is determined by ordering the sub-grids by the measured values of $d_i$, relative to the maximum value $d_{max}$, corresponding to the reference sub-grid layer. The subsequent process layers are ordered according the their assigned sub-grid periods.

The fit of the function in Equation (3) to the digitized signals illustrated in FIG. 13 determines the parameters and measured outputs listed below in Table 3:

TABLE 3

|   | Units | 1-Isolation Signal | 2-Gate Signal |
|---|---|---|---|
| A | grayscale | 38700.849 | 33263.131 |
| B | grayscale | −2094.092 | 4576.114 |
| d | pixels | 11.829 | 11.390 |
| s | pixels | 82.409 | 82.309 |
| c | nanometers | 105.673 | 105.356 |
| Δx | nanometers | | 10.551 |
| $\epsilon_{pxl}$ | nanometers | | 0.016 |

Monitoring the magnitude of $\epsilon_{pxl}$ using Equation (5) provides a check on the validity of the overlay measurement between any pair of sub-grids. In this case, the effect of pixel size uncertainty on the overlay error ($\delta_{pxl}$<0.02 nm) is negligible.

Figure 14:
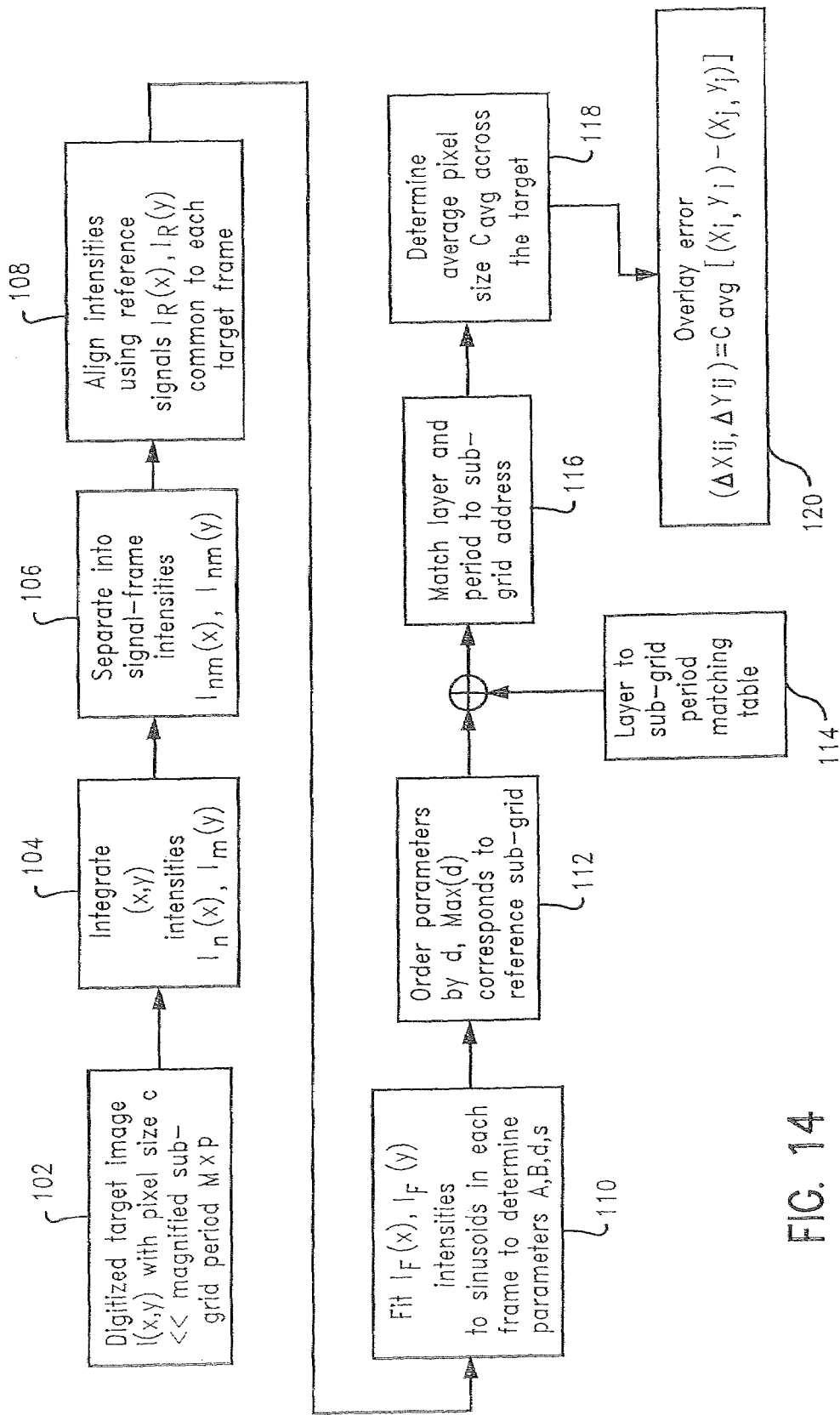
FIG. 14 is a flowchart of the preferred steps of the overlay extraction method of the present invention.

A general flowchart of the overlay error extraction method that we have examined in the example above, is shown in FIG. 14. In the first step 102, the target image is scanned in the x- and y-directions to produce a digitized target image I (x, y) with a pixel size much smaller than the magnified sub-grid period M×p. The (x, y) scanned intensities are than integrated 104 into intensities $I_n$ (x) and $I_m$ (y). The integrated intensities are then separated 106 into single frame intensities $I_{nm}$ (x) and $I_{nm}$ (y). The single frame intensities are then aligned 108 using reference signals $I_R$ (x) and $I_R$ (y) common to each target frame. The $I_F$(x) and $I_F$(y) intensities are then fit 110 to sinusoids in each frame to determine the parameters A, B, d and s, where parameter d is the ratio of pixel size c to sub-grid period p and parameter s measures the center of the sinusoidal patterns.

The parameters are then ordered 112 by d, where Max (d) corresponds to the reference sub-grid. The layer to sub-grid period matching table 114 is then used to match layer and period sub-grid address 116. Thereafter, the average pixel size $c_{avg}$ is determined across the target 118, and the overlay error is calculated 120 as:

$$(\Delta x_{ij}, \Delta y_{ij}) = c_{avg}[(x_i, y_i) - (x_j, y_j)] \quad (6)$$

Thus, the present invention provide an improved overlay target composed of a reference grid and nested sub-grids that is compact and exhibits sub-nanometer measurement precision on commercially available metrology tools. The present invention also provides a method of analyzing the images captured from the inventive overlay target. The target is able to leverage high pattern density and isolated sub-pattern images, to enable in situ compensation for imaging system distortion, and the simultaneous capture and measurement of multiple sub-pattern images. The target encodes each sub-pattern with a machine-readable identifier, so that it is able to match sub-pattern groups to the alignment tree of the functional circuit being manufactured, while being tailored to the ground-rules of the layers on which it is printed.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A metrology tool system comprising a plurality of metrology tools, each metrology tool comprising a stage for securing a lithographically produced semiconductor substrate, an energy source, a lens for directing energy from the energy source onto a surface of the substrate, a lens for capturing an image of a structure lithographically produced on the substrate, and an image processor for measuring distance between points on the image of the lithographically-produced structure on the substrate, each metrology tool stage including an alignment target mounted thereon comprising a first contrasting set of elements forming a first grid pattern having a distance between elements; the first grid pattern having a plurality of grid segments in at least one of the x and y directions, and at least one second contrasting set of elements forming a second grid pattern having a distance between elements, the second grid pattern having a plurality of grid segments in the x and y directions, the distance between the second set of elements being less than the distance between the first set of elements, the second grid pattern being disposed within one of the first grid pattern segments, each metrology tool being adapted to be calibrated by measuring a period of the grid segments in the grid patterns on the alignment target permanently mounted to the tool stage.

2. The metrology tool system of claim 1 wherein the first grid pattern has a plurality of grid segments in both the x and y directions.

3. The metrology tool system of claim 1 wherein the grid segments formed by the grid patterns comprise an array of rectilinear frames, each frame having x and y dimensions equal to the distance between elements in the first and second set of elements.

4. The metrology tool system of claim 1 wherein the grid segments formed by the grid patterns comprise an array of nominally square frames, each frame having equal x and y dimensions corresponding to the distance between the elements in the first and second set of elements.

5. The metrology tool system of claim 1 wherein the grid segments formed by the grid patterns comprises an array of rectilinear frames, and further including a pattern recognition feature associated with one of the frames.

6. The metrology tool system of claim 1 wherein the elements are selected from the group consisting of continuous lines, discontinuous lines, parallel lines, and aligned points.

7. The metrology tool system of claim 1 wherein each metrology tool is an optical metrology tool.

8. The metrology tool system of claim 7 wherein each optical tool has a light source of wavelength $\lambda$, numerical aperture NA, and a partial coherence $\sigma$, and wherein the second set of elements in the second grid pattern have period p defined by the expression:

$$p \geq \lambda/(NA(1+\sigma)).$$

9. The metrology tool system of claim 7 wherein each optical tool has a light source of wavelength $\lambda$, numerical aperture NA, and a partial coherence $\sigma$, and wherein the second set of elements in the second grid pattern have period p defined by the expression:

$$p/2 \geq \lambda/(NA(1+\sigma)) < p.$$

10. The metrology tool system of claim 1 including a plurality of second grid patterns, each of the second grid patterns being disposed within different segments of the first grid pattern.

11. The metrology tool system of claim 1 including a plurality of second grid patterns disposed between different segments of the first grid pattern, and wherein each of the second grid patterns has a different distance between the second sets of elements therein.

* * * * *